United States Patent
Zeidler

(10) Patent No.: US 10,388,487 B2
(45) Date of Patent: Aug. 20, 2019

(54) METHOD FOR OPERATING A MULTI-BEAM PARTICLE MICROSCOPE

(71) Applicant: Carl Zeiss Microscopy GmbH, Jena (DE)

(72) Inventor: Dirk Zeidler, Oberkochen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 15/298,536

(22) Filed: Oct. 20, 2016

(65) Prior Publication Data

US 2017/0117114 A1 Apr. 27, 2017

(30) Foreign Application Priority Data

Oct. 22, 2015 (DE) .................. 10 2015 013 698

(51) Int. Cl.
*H01J 37/04* (2006.01)
*H01J 37/21* (2006.01)
*H01J 37/28* (2006.01)

(52) U.S. Cl.
CPC ............. *H01J 37/04* (2013.01); *H01J 37/21* (2013.01); *H01J 37/28* (2013.01); *H01J 2237/2801* (2013.01)

(58) Field of Classification Search
CPC .... H01J 2237/2801; H01J 37/04; H01J 37/21; H01J 37/28
See application file for complete search history.

(56) References Cited

U.S. PATENT DOCUMENTS

| | | | | |
|---|---|---|---|---|
| 5,430,292 A | * | 7/1995 | Honjo | G03F 1/86 |
| | | | | 250/310 |
| 6,027,663 A | * | 2/2000 | Martin | H01J 37/32027 |
| | | | | 216/66 |

(Continued)

FOREIGN PATENT DOCUMENTS

| DE | 10 2013 014 976 A1 | 3/2015 |
|---|---|---|
| WO | WO 2012/112894 A2 | 8/2012 |

OTHER PUBLICATIONS

A.L. Eberle et al., "High-resolution, high-throughput imaging with a multibeam scanning electron microscope", Journal of Microscopy 259, 2015, pp. 114-120.

(Continued)

*Primary Examiner* — Nicole M Ippolito
*Assistant Examiner* — Sean M Luck
(74) *Attorney, Agent, or Firm* — Fish & Richardson P.C.

(57) ABSTRACT

A method includes: generating a multiplicity of particle beams such that the particle beams penetrate a predetermined plane side-by-side and have within a volume region around the predetermined plane in each case one beam focus; scanning a first region of the surface of an object with the particle beams and detecting first intensities of particles produced by the particle beams while setting an operating parameter of the multi-beam particle microscope; and determining first values of an object property based on the first intensities. The first values represent the object property within the first region, and the object property represents a physical property of the object. The method also includes determining a second value of the operating parameter for use for a second region of the surface based on the first values of the object property.

28 Claims, 9 Drawing Sheets

(56) References Cited

U.S. PATENT DOCUMENTS

| | | | |
|---|---|---|---|
| 6,252,412 B1* | 6/2001 | Talbot | G06T 7/0004 |
| | | | 324/754.22 |
| 6,407,398 B1* | 6/2002 | Kurokawa | B82Y 10/00 |
| | | | 250/491.1 |
| 6,573,499 B1* | 6/2003 | Sasajima | G01N 23/225 |
| | | | 250/306 |
| 6,943,351 B2* | 9/2005 | Parker | H01J 37/065 |
| | | | 250/306 |
| 2004/0113073 A1* | 6/2004 | Nakasuji | H01J 37/067 |
| | | | 250/306 |
| 2006/0054817 A1* | 3/2006 | Parker | H01J 37/244 |
| | | | 250/310 |
| 2006/0145087 A1* | 7/2006 | Parker | H01J 9/42 |
| | | | 250/396 R |
| 2006/0169899 A1* | 8/2006 | Parker | H01J 9/42 |
| | | | 250/310 |
| 2007/0187595 A1* | 8/2007 | Tanaka | G01N 23/2251 |
| | | | 250/307 |
| 2009/0206259 A1* | 8/2009 | Obara | H01J 37/21 |
| | | | 250/311 |
| 2009/0212213 A1* | 8/2009 | Nakasuji | G01N 23/2251 |
| | | | 250/310 |
| 2009/0256075 A1 | 10/2009 | Kemen et al. | |
| 2009/0272900 A1* | 11/2009 | Nir | H01J 37/21 |
| | | | 250/307 |
| 2010/0148087 A1* | 6/2010 | Doering | B82Y 10/00 |
| | | | 250/396 R |
| 2010/0227200 A1* | 9/2010 | Miyata | H01J 37/153 |
| | | | 428/800 |
| 2011/0233400 A1* | 9/2011 | Matsumoto | G01B 15/00 |
| | | | 250/307 |
| 2013/0187046 A1 | 7/2013 | Zeidler et al. | |
| 2013/0252145 A1* | 9/2013 | Matsumoto | H01J 37/3007 |
| | | | 430/30 |
| 2014/0224985 A1 | 8/2014 | Rodgers et al. | |
| 2015/0069235 A1 | 3/2015 | Kemen et al. | |

OTHER PUBLICATIONS

M. Enyama et al., "Optical system for a multiple-beam scanning electron microscope", Journal of Vacuum Science & Technology, B 32, 2014, pp. 051801-1-051801-6.

D. Kaczmarek, "Backscattered electrons topographic mode problems in the scanning electron microscope", Scanning Microscopy, vol. 12, No. 1, 1998, pp. 161-169.

T. Suganuma, "Measurement of surface topography using SEM with two secondary electron detectors", Journal of Electron Microscopy, vol. 34, No. 4, 1985, pp. 328-337.

German Office Action, with translation thereof, for corresponding DE application No. 10 2015 013 698.4 dated Apr. 28, 2016.

* cited by examiner

METHOD FOR OPERATING A MULTI-BEAM PARTICLE MICROSCOPE

CROSS-REFERENCE TO RELATED APPLICATION

This application claims benefit under 35 U.S.C. § 119 to the German Patent Application No. 10 2015 013 698.4 filed on Oct. 22, 2015. The entire disclosure of this patent application is incorporated into the present application by reference.

FIELD

The disclosure relates to a method for operating a multi-beam particle microscope.

BACKGROUND

Just like single-beam particle microscopes, multi-beam particle microscopes can be used to analyse objects on a microscopic scale. Images of an object that represent a surface of the object, for example, can be recorded using these particle microscopes. In this way, for example the structure of the surface can be analysed. While in a single-beam particle microscope a single particle beam of charged particles, such as electrons or ions, is used to analyse the object, in a multi-beam particle microscope, a multiplicity of particle beams are used for this purpose. The multiplicity of the particle beams, also referred to as a bundle, is directed onto the surface of the object at the same time, as a result of which a significantly larger area of the surface of the object can be scanned and analysed as compared to a single-beam particle microscope within the same period of time.

To this end, a multi-beam particle microscope includes numerous particle-optical components that produce and manipulate the multiplicity of particle beams. By way of example, a multi-beam particle microscope includes components which are configured to generate electric and/or magnetic fields in order to manipulate the particle beams, for example deflect them or change them in terms of their form. In particular, a multi-beam particle microscope can include a particle-optical lens which focuses each or individual ones of the particle beams. In addition, a multi-beam particle microscope can include a stigmator which can change the form of at least some of the particle beams, for example in order to correct a sub-optimal effect of another particle-optical component of the multi-beam particle microscope. In addition, further field generators may be provided, which can generate higher-order multipole fields, for example hexapole fields, so as to be able to compensate higher-order aberrations.

For the quality of an analysis of an object, it is generally desirable for the particle beams of the bundle to be focused on the surface of the object to be analysed. Similarly, it is generally advantageous for the quality of the analysis of the object if the particle beam spot that is illuminated by the particle beams on the surface of the object has a round shape, i.e. for the particle beams on the surface of the object to have an at best insignificant astigmatism. Arranging the surface of the object to be analysed within the focus of a particle beam is typically referred to as focusing. Focusing can typically be effected by manipulating the particle beams by correspondingly controlling particle-optical components of the multi-beam particle microscope or by correspondingly controlling the positioning of the object. Optimizing the particle beam spots that are illuminated by the particle beams, i.e. optimizing the form of the particle beams on the surface of the object, is typically referred to as stigmatizing. Stigmatizing is typically effected by way of manipulating the form of the particle beams, in particular by correspondingly controlling one or more stigmators and/or field generators of the multi-beam particle microscope.

Focusing, stigmatizing and correcting higher-order aberrations in manual operation of the multi-beam particle microscope by a user are time-consuming processes that involve a high level of experience of the user. Methods for automated focusing, stigmatizing and correcting higher-order aberrations are known both in the field of single-beam particle microscopes and in the field of multi-beam particle microscopes. In some of these traditional methods, a plurality of particle-optical images of the same region of the surface of the object are recorded at different focusing or stigmatization settings so as to obtain herefrom an optimized setting for the focusing and stigmatization. By recording a plurality of images of the same region, these processes are time-consuming and reduce the throughput of the multi-beam particle microscope, i.e. the ratio of the area of the surface of the object to be analysed for a particular quality to a specified period of time.

In other traditional methods, in addition to the imaging particle beams serving for producing the image, further auxiliary beams are directed at the object which do not serve for producing the image, but only for setting the microscope in order to determine the quality of the focusing or stigmatization setting. The auxiliary beams are directed onto the region of the object to be imaged, i.e. the region of the surface of the object that is illuminated by the imaging particle beams, or on a region of the object that is arranged next to the region to be imaged. Charge carriers can accumulate in the region to be imaged in either case, i.e. the region to be imaged is contaminated. The charge that has accumulated in the region to be imaged generates electric fields in the region of the surface of the object that act on the imaging particle beams, as a result of which the particle beams are defocused or changed in terms of their form. These errors in focusing or stigmatization and also higher-order aberrations caused thereby deteriorate the quality of the images that are detected via the imaging particle beams.

SUMMARY

The disclosure seeks to provide a method for operating a multi-beam particle microscope which permits the throughput to be increased while at least maintaining the quality of the analysis. It is furthermore an object of the present disclosure to provide a method for operating a multi-beam particle microscope in which contamination of a region of an object that is to be imaged by the multi-beam particle microscope, which contamination is caused by the setting of the multi-beam particle microscope, is minimized, or in which such contamination can be prevented entirely. It is furthermore an object of the present disclosure to provide a method for operating a multi-beam particle microscope with which the object can be analysed more quickly, more precisely and/or more extensively.

One embodiment provides a method for operating a multi-beam particle microscope with which an operating parameter of the multi-beam particle microscope can be set, based on a single scan of a region of a surface of an object, such that another scan of the same region can be effected with an optimum setting of focusing and/or stigmatization.

According to this embodiment, repeat scanning of the region of the surface of the object with different values of the operating parameter, for example with different focusing and/or stigmatization, is in particular not necessary in order to optimally set the multi-beam particle microscope for scanning the region.

One embodiment of a method for operating a multi-beam particle microscope includes generating a bundle made up of a multiplicity of particle beams, with the result that the particle beams penetrate a predetermined plane side-by-side and have within a volume region around the predetermined plane in each case one beam focus; arranging a surface of an object at least partially within the volume region; scanning a first region of the surface with the bundle and detecting first intensities of particles produced by the particle beams that are incident on the first region, while an operating parameter of the multi-beam particle microscope is set to a first value.

In particular, each of the particle beams of the bundle can scan a subregion of the first region and to this end be directed successively onto a multiplicity of sites within the respective subregion, wherein the subregions at most partially overlap. It is furthermore possible to assign each of the sites the intensity caused during the directing of the respective particle beam onto the site.

For producing the bundle, which is made up of the multiplicity of particle beams, of at least two particle beams, the multi-beam particle microscope can include a beam generation apparatus which provides a bundle of particle beams that are oriented to be substantially parallel to one another. The particle beams can be beams of charged particles, in particular beams of ions or electrons. In particular, the particle beams can be oriented to be substantially parallel to an optical axis of the multi-beam particle microscope. Each of the particle beams of the bundle can pass through a component of the multi-beam particle microscope that is configured to focus the particle beams, i.e. the component provides the action of a particle-optical lens. Furthermore, the particle beams of the bundle can pass through a component that provides the action of a stigmator. A stigmator is configured to manipulate the form of the particle beams of the bundle such that, for example, a cross section of the particle beams can be changed in terms of its form. Furthermore, the particle beams of the bundle can pass through a component which generates an electric and/or magnetic field and is configured to change the form of the particle beams, as a result of which higher-order aberrations can be corrected. The bundle can include, for example, 25, 61 or a different number of particle beams of this order of magnitude.

Each of the particle beams of the bundle has a beam focus. The beam focus of each particle beam is characterized for example in that the particle beam has a beam waist in the beam focus. In the astigmatically shaped particle beams, the beam focus can be defined in that the beam focus is situated centrally between the line foci of the astigmatic particle beam. A particle beam is astigmatic if the particle beam is differently convergent in different planes which include the propagation direction of the particle beam. In particular, these planes are orthogonal relative to one another and include the propagation direction of the particle beam along their intersecting axis.

The predetermined plane can be arranged in the region of the beam foci of the particle beams. In particular, the predetermined plane can include at least one of the beam foci of the particle beams of the bundle. The predetermined plane can include all beam foci of the particle beams of the bundle, to which end the predetermined plane can be a curved area. The particle beams of the bundle penetrate the predetermined plane side-by-side. In particular, the particle beams do not overlap in the predetermined plane, with the result that if a surface of an object is arranged in the predetermined plane or at least partially within the volume region, the particle beams illuminate particle beam spots on the surface which are spaced apart from one another and the particle beam spots do not superpose. The volume region can have an extent of up to 10 cm, 1 cm, 1 mm or 500 μm around the predetermined plane and/or the beam foci.

While an operating parameter of the multi-beam particle microscope is set to a first value, the first region of the surface is scanned with the bundle. Each of the particle beams of the bundle can to this end scan a subregion of the first region, wherein the subregions at most partially overlap. The subregions can be adjacent sections of the surface of the object. For scanning a subregion, the particle beam is successively directed onto a multiplicity of sites within the subregion. While the bundle thus scans the first region, each individual one of the particle beams of the bundle scans a subregion of the first region that is assigned thereto.

The operating parameter can represent a setting of a component of the multi-beam particle microscope that is suitable for focusing, stigmatization or correcting higher-order aberrations. In particular, the operating parameter can serve for controlling at least one component of the multi-beam particle microscope which is configured to change a distance of the beam foci from the predetermined plane and/or a form of the particle beams on the surface and/or a position of the object in a direction parallel to an optical axis of the multi-beam particle microscope. Such components can include, for example, particle-optical lenses and/or stigmators and/or field generators for generating electric and/or magnetic fields, for example higher-order multipole fields (e.g. hexapole field). In other words, the first region of the surface of the object is scanned at a first setting of the focusing and/or stigmatization and/or setting of at least one field generator.

The multi-beam particle microscope can have an optical axis about which the bundle of particle beams is able to be deflected and the predetermined plane can be oriented substantially orthogonally to the optical axis.

A detector can be provided for each of the particle beams of the bundle, which detector is configured to detect the particles produced by the particle beam that is incident on the surface. By way of example, a separate detection area of one or more detectors can be provided for each of the particle beams, and the particles produced by the incident bundle at the same time from the different sites on the sample can be directed onto the detection areas such that each site can be assigned exactly one detection area. While a particle beam is directed onto a site, the particles produced at this site can be detected, with the result that an intensity corresponding to the produced particles can be measured and assigned to the site. It is thus possible to assign each of the sites of the subregion onto which a particle beam of the bundle is directed an intensity that corresponds to the produced particles that are produced as a result of the particle beam being directed onto this site. The produced particles can, for example, be ions or electrons, in particular secondary ions or electrons, mirrored ions or electrons, transmitted ions or electrons or (back)scattered ions and electrons.

The method furthermore includes: determining first values of an object property based on the first intensities, wherein the first values represent the object property within the first region, and wherein the object property represents a physical property of the object.

The object property is a physical property of the object, i.e. a property that is conditional on the object. The first values of the object property represent the object property within the first region. Other values of the object property represent the object property within another region.

The object property can represent, for example, a spatially resolved height distribution. The first values in this case represent the spatially resolved height distribution within the first region. The spatially resolved height distribution represents a distance between a site on the surface of the object and the predetermined plane. Since the predetermined plane is arranged in the region of the beam foci of the particle beams, the height or the spatially resolved height distribution represents a measure of the quality of the focusing of the particle beams on the object. Alternatively, the height can also be measured in relation to a different reference than the predetermined plane.

In addition or alternatively, the object property can represent a spatially resolved charge distribution, a spatially resolved distribution of magnetic properties of the object, or a spatially resolved distribution of virtual charge, which can occur, for example, through interaction of an electrostatic field with a height step at the edge of the object. The first values in this case represent the spatially resolved charge distribution or the spatially resolved distribution of magnetic properties or the spatially resolved distribution of virtual charge within the first region. The charge distribution represents the spatial distribution of charge (carriers) within the object or within a region of the object.

(Virtual) charge or magnetization situated in the object or region of the object generates an electric or magnetic field which acts on the particle beams that are directed onto the object, as a result of which aberrations can be induced. The spatially resolved charge distribution or the spatially resolved distribution of magnetic properties or the spatially resolved distribution of virtual charge is therefore a measure of the fields which are generated by the charge distribution and can cause aberrations.

In addition or alternatively, the object property can represent a spatially resolved field distribution of electric and/or magnetic fields which are generated by a charge distribution within the object. The first values in this case represent the spatially resolved field distribution within the first region, in particular on the surface.

According to one exemplary embodiment herein, the first values of the object property for each of the subregions of the first region are determined on the basis of the first intensities that are assigned to the sites within the subregion.

In this embodiment, at least one first value of the object property is determined for each of the subregions of the first region. In each of the subregions, the at least one value is determined on the basis of the first intensities that are assigned to the sites within the subregion. The number of the determined first values for the first region is thus equal to or greater than the number of subregions or equal to or greater than the number of particle beams of the bundle. In this way, the object within the first region is extensively characterized.

According to one exemplary embodiment, the method furthermore includes: determining first beam values based on the first intensities, wherein the first beam values represent at least one property, in particular a form or a size, of the particle beams on the surface of the object, and wherein the first values of the object property are determined based on the first beam values.

The first beam values can represent a size and/or form of the particle beam on the surface of the object. The beam values thus approximately represent the size or form of the particle beams in cross section, i.e. substantially perpendicular to the propagation direction of the particle beams, in the region of the surface of the object. The form (of the cross section) of a particle beam can be approximated, for example, as a circle or ellipse and be parameterized accordingly by one or more beam values. If the form (of a cross section) of a particle beam is approximated by a circle, the beam value can represent, for example, the radius or the diameter of the circle. If the form (of the cross section) of the particle beam is parameterized by an ellipse, the beam value can represent a long main axis, a short main axis and/or an orientation of the ellipse, with respect to a reference direction. However, the parameterization is not limited to circles or ellipses.

Since the form of a particle beam on the surface of the object corresponds to the particle beam spot illuminated by the particle beam, a beam value can also represent a variable that is dependent indirectly or directly on the particle beam spot, for example a resolution that is attainable with the particle beam. The particle beam spot illuminated by a particle beam on the surface is critical for the resolution with which structures of the surface of the object can be detected and analysed. The (first) beam values can therefore be determined for example by the analysis of the resolution of a graphic presentation of the first intensities. In particular, the (first) beam values can be determined by a gradient method, a Fourier analysis, an autocorrelation analysis or the like of the first intensities.

In particular, it is possible for each of the particle beams to determine at least one first beam value on the basis of the first intensities caused by the respective particle beam. In this embodiment, at least one first beam value is determined for each of the particle beams of the bundle. The at least one first beam value of a subregion is determined on the basis of that intensity of the first intensities assigned to the sites within the subregion onto which the particle beam was directed. Therefore, the at least one first beam value of the particle beam is determined merely based on first intensities of the type that are caused by this particle beam. The number of the first beam values is therefore equal to or greater than the number of particle beams and correspondingly equal to or greater than the number of subregions. For determining the (first) values of the object property, a multiplicity of beam values is thus available, whereby the accuracy of the (first) values of the object property is improved.

According to one exemplary embodiment herein, the method furthermore includes: providing reference beam values which represent at least one property, in particular a form or size, of the particle beams at a reference surface of a reference object; determining a deviation between the first beam values and the reference beam values; and wherein the first values of the object property are determined based on the deviation.

For determining the first values of the object property from the deviations, a physical model can be used which models the relationship between the deviations and the object property in general. The deviations can represent, for example, aberrations which are caused by differences between the reference beam values to be expected on the basis of the setting of the microscope and the actually occurring beam values.

Since beam values represent properties, in particular the size or the form, of the particle beam on the surface, the beam values serve as a measure of the aberrations caused by the object property. If, for example, the height distribution is assumed as the object property, it is possible to interpret the beam values, on the basis of the reference beam values, as to whether overfocusing is present, i.e. that the beam foci are situated upstream of the surface in the beam direction, or whether underfocusing is present, i.e. that the beam foci are situated downstream of the surface of the object in the beam direction. To this end, the beam values of different particle beams can be correlated and compared to the reference beam values or be interpreted on account of the reference beam values such that the distance between the beam foci and the surface of the object can be deduced. The comparing and interpreting can be implemented by the physical model which, for example, takes into account a steady relationship between the operating parameter and the beam values.

The reference beam values can be calculated analytically for example by calculation on the basis of the first operating parameter for the reference object, for example by electron-optical simulation, wherein the reference object is similar to the object, i.e. has in particular a physical behaviour which is previously known within limits. By way of example, the object property of the object or of the reference object can be steady and/or have a limited maximum gradient.

In particular, the reference beam values can be calculated on the basis of data which represent properties of the particle beams, in particular represent a location of the beam foci relative to the predetermined plane and/or an astigmatism of the particle beams and/or a diameter of the particle beams at the beam foci thereof and/or a form of a cross section of the particle beams in the predetermined plane, in particular if the operating parameter of the multi-beam particle microscope is set to the first value. The properties of the particle beams, for example the location of the beam foci, the astigmatism and/or the form of the cross section, can be provided in spatially dependent fashion, i.e. a spatially resolved distribution of the property is provided for calculating the reference beam values.

The properties of the particle beams of the bundle refer in particular to a spatial form and arrangement of the particle beams. The properties can be suitable for characterizing the particle beams of the bundle with respect to the spatial form thereof or properties that are directly dependent thereon, for example the form of the cross section of the particle beams, or properties that are indirectly dependent, for example a resolution that is attainable with the particle beams. The properties of each individual one of the particle beams of the bundle which are represented by the data include, for example, a location of the beam foci relative to the predetermined plane. The location of the beam foci corresponds to the position of the beam foci and/or an orientation of the beam focus with respect to a predetermined direction. In particular, the location includes a distance of the beam foci to the predetermined plane along an optical axis of the multi-beam particles system and/or along a propagation direction of the particle beams. Additionally or alternatively, the provided data include a location of the beam foci relative to one another, in particular a distance of the beam foci with respect to one another along a predetermined direction, for example parallel to an optical axis of the multi-beam particle system. Additionally or alternatively, the properties represented by the data can include an astigmatism of the particle beams. The astigmatism of the particle beams is characterizable for example by the distance of the line foci of the particle beam and/or the orientation of the line foci relative to an optical axis of the multi-beam particle system and/or the propagation direction of the particle beams. The astigmatism of a particle beam can furthermore be characterized by the convergence angles of the particle beam. The properties can furthermore or alternatively include a diameter of each particle beam of the bundle at the beam focus thereof.

Additionally or alternatively, the properties can include a form of a cross section of each of the particle beams of the bundle in the predetermined plane. The cross section of the particle beam can be taken for example in a plane that is orthogonal to the propagation direction of the particle beam or in a plane that is orthogonal to an optical axis of the multi-beam particle microscope. The form of the cross section consists of the shape of the cross section and/or a measure of the size of the cross section.

Alternatively or additionally to calculating the reference beam values, the latter can be measured and stored in advance. In this case, the reference beam values are determined using the multi-beam particle microscope and the reference object with the reference surface. This can be done as follows, for example: arranging the reference surface of the reference object at least partially within the volume region, in particular in the predetermined plane; scanning the reference surface with the particle beams and detecting intensities of particles, which are produced by the particle beams that are incident on the reference surface, during the scanning of the reference surface; determining the reference beam values based on the intensities detected during the scanning of the reference surface. Furthermore, at least one reference beam value for each of the particle beams can be determined based on the intensities detected during the scanning of the reference surface. The reference beam values can therefore be correlated with an operating parameter, in particular the first operating parameter, and the object properties of the reference object.

For determining the reference beam values, provision may furthermore be made for the reference surface of the reference object to be arranged relative to the predetermined plane in at least two different ways. By way of example, the reference surface can be displaced along an optical axis of the multi-beam particle microscope, and the reference beam values of the particle beams are determined while the reference surface is arranged at the respective positions.

An object having a previously known object property can be used, for example, as the reference object. By way of example, a reference object having a previously known reference surface, i.e. a previously known spatially resolved height distribution, can be used. The object can have a surface roughness which can be described by a root mean square. For the root mean square σRMS of the surface roughness, the following can apply: σRMS<10 µm, in particular σRMS<5 µm, σRMS<2 µm or σRMS<1 µm; wherein σRMS indicates a root mean square, averaged over a length of a length region, of a difference between height values of sites arranged within the length region on the reference surface and a linear mean of the height values, wherein the length is at least 100 µm. The reference surface is advantageously highly electrically conductive and not magnetic.

In this embodiment, the reference surface is substantially flat. However, determining the provided data or reference beam values can also be carried out with any other reference surface, as long as the object property of the reference object is previously known.

Provision may furthermore be made for the reference beam values and/or the beam values to be determined from the detected intensities via a gradient method, a Fourier analysis, an autocorrelation or the like.

According to one exemplary embodiment, the method furthermore includes: determining a second value of the operating parameter for use for a second region of the surface based on the first values of the object property. The second value of the operating parameter representing a setting of at least one component of the multi-beam particle microscope, for example focusing and/or stigmatization and/or higher-order correction, is determined on the basis of the first values of the object property, therefore in particular on the basis of the first beam values and the reference beam values.

For determining the second value of the operating parameter, an optimization method can be used in which the second value of the operating parameter is determined such that an optimization target is achieved. The optimization target can be, for example, minimizing the deviation between beam values and the reference beam values or a difference between measured and desired object property. To this end, provision may be made for the optimization method to be able to simulate the deviation that is to be expected when using the second value of the operating parameter on the basis of the first values of the object property which are determined from the determined deviation.

According to an exemplary embodiment, the second value of the operating parameter is different from the first value of the operating parameter. In particular, the second value of the operating parameter deviates from the first value by at least 0.1% or 1% of the first value.

According to one exemplary embodiment, the second region at least partially overlaps the first region. In particular, the second region is identical to the first region. At least partially overlapping can mean in particular that the second region overlaps at least 50%, at least 80%, at least 90% or at least 95% of a total area of the first region and/or that a geometric centre of the second region has a distance from a geometric centre of the first region that is at most 50%, at most 30%, at most 20% or at most 10% of an extent of the first region.

In this embodiment, the second region and the first region can be substantially congruent. The second value of the operating parameter, for example optimized focusing and/or optimized stigmatization and/or higher-order correction, can thus be used in a region of the surface of the object which is similar to the scanned region.

According to one exemplary embodiment, the second region at most partially overlaps the first region. At most partially means in particular that the second region overlaps at most 50%, at most 20%, at most 10%, at most 5% or at most 1% of a total area of the first region or that a geometric centre of the second region has a distance from a geometric centre of the first region that is at least 50%, at least 70%, at least 80% or at least 90% of an extent of the first region.

In this embodiment, the second region substantially differs from the first region. The second value of the operating parameter can thus be used in a region of the surface of the object which substantially differs from the scanned region. By way of example, an optimized setting of the focusing and/or stigmatization for a second region which neighbours the first region is determined.

According to one exemplary embodiment, the method furthermore includes: determining first prediction values based on values of the object property, wherein the prediction values represent a predicted value of the object property for the second region, wherein the values of the object property include at least the first values of the object property, and wherein the second value of the operating parameter is determined based on the prediction values.

In this embodiment, first prediction values for the second region are determined based on the values of the object property which include the values of the object property of the first region. Each of the first prediction values represents a predicted value of the object property, for example a distance between a prediction site arranged within the second region on the surface and the predetermined plane. While the first values of the object property are determined based on the first intensities or the first beam values and possibly the reference beam values, the prediction values are determined from the values of the object property. By way of example, the prediction values are determined by extrapolating and/or interpolating the first values of the object property. To this end, for example a physical model can be used which models the physical behaviour of the object property. If the spatially resolved height distribution is assumed as the object property, for example a differential equation system of a clamped plate can be used as a physical model.

The physical model can provide for the object property to behave in a steady manner over a spatial region which corresponds to the size of the first region. The inventors have found that the assumption of steadiness for the object property of objects which are able to be analysed at a high throughput via multi-beam particle microscopes is justified. As a result, the extrapolation/interpolation of the values of the object property can be carried out with a high level of accuracy.

According to one exemplary embodiment, the values of the object property include further values of the object property that represent the object property within at least one further region of the surface, wherein the at least one further region in each case at most partially overlaps the first and second regions.

In this embodiment, not only the first values of the object property of the first region are used for extrapolation/interpolation, but also the further values of the object property of the at least one further region. The further values can be produced in the same or a similar way as the first values. Hereby, the prediction values are determined from a greater set of values, as a result of which the accuracy of the prediction values can be improved.

According to one exemplary embodiment, the second region can be scanned with the bundle of particle beams in the same or a similar way as the first region. In particular, the method furthermore includes: scanning the second region with the bundle, while the operating parameter is set to the second value, wherein each of the particle beams of the bundle scans a subregion of the second region and to this end is directed successively onto a multiplicity of sites within the subregion, wherein the subregions at most partially overlap; and detecting second intensities of particles produced by the particle beams that are incident on the second region, wherein each of the sites is assigned the intensity caused during the directing of the respective particle beam onto the site.

In this embodiment, the second value of the operating parameter, which was previously determined for example on the basis of extrapolation of the first values of the object property of the first region, is used as the setting for the multi-beam particle microscope, while the second region is scanned with the bundle of particle beams. Analogously to scanning the first region using the first value of the operating parameter, it is thus possible to scan the second region using the second value of the operating parameter. Consequently, a value of the operating parameter that has already been optimized for the second region is used for scanning the second region. The description of the scanning and detecting of the above embodiments applies analogously.

According to one exemplary embodiment, the method furthermore includes: determining a third value of the operating parameter for use for a third region of the surface based on the second intensities. The third region of the surface can differ from the first and the second region and at most partially overlap them, for example. The third region can thus substantially differ from the first and second regions. The previously described delimitation options between the first and second regions can therefore be applied analogously to the third region, with the result that these delimitation options can apply in a similar way between the third and the first regions and between the third and the second regions. In this embodiment, a third value of the operating parameter is determined for a third region of the surface. The third value is determined based on the second intensities, which in turn were determined with the second value of the operating parameter which, as opposed to the first value of the operating parameter, is a value of the operating parameter that is already optimized for the second region.

According to one exemplary embodiment herein, the method furthermore includes: determining second values of the object property for the second region based on the second intensities, in particular based on second beam values and optionally second reference beam values which represent reference beam values for the second region.

In this embodiment, second values of the object property are determined for the second region, wherein the second values are determined directly from the second intensities or alternatively from the second beam values which in turn can be determined from the second intensities using the approach explained above. In particular, at least one second value of the object property can be determined for each of the subregions of the second region. As opposed to the first values of the object property, which were determined based on a value of the operating parameter that is not optimized for the first region, i.e. in the case of focusing and/or stigmatization and/or higher-order correction that is not optimized for the first region, the second values of the object property are determined with a value that is optimized for the second region, the second value of the operating parameter, and can therefore be determined with greater accuracy than the first values.

According to one exemplary embodiment herein, the method furthermore includes: determining second prediction values for the third region of the surface based on the second values of the object property of the second region, wherein the second prediction values represent the predicted object property within the third region; wherein the third value of the operating parameter is determined based on the second prediction values of the third region.

In this embodiment, second prediction values are determined for the third region analogously to the determination of the first prediction values. Analogously to the determination of the second value of the operating parameter from the first prediction values, the third value of the operating parameter is determined from at least the second prediction values.

According to one exemplary embodiment herein, the second prediction values of the third region are furthermore determined based on the first values of the object property of the first region.

In this embodiment, in addition to the second values of the object property, the first values of the object property of the first region are also used for determining the second prediction values. As a result, more values of the object property are available that can be used for determining the second prediction values, as a result of which the accuracy of the second prediction values can be improved. The continuation to n prediction values is effected analogously.

According to one exemplary embodiment, the method furthermore includes: displacing the object in a direction that is substantially orthogonal to an optical axis of the multi-beam particle microscope during the scanning of the surface of the object.

According to one exemplary embodiment, the method furthermore includes: producing an image of the surface of the object from the detected intensities, in particular the first intensities and/or the second intensities. Provision may in particular be made for no further particle beams other than the particle beams of the bundle to reach the surface of the object.

In this embodiment, all particle beams are used both for producing an image of the surface of the object and for determining a value of the operating parameter for second, third etc. regions. In particular, only particle beams which are used for producing the image are directed onto the surface of the object.

DETAILED DESCRIPTION

Figure 1:
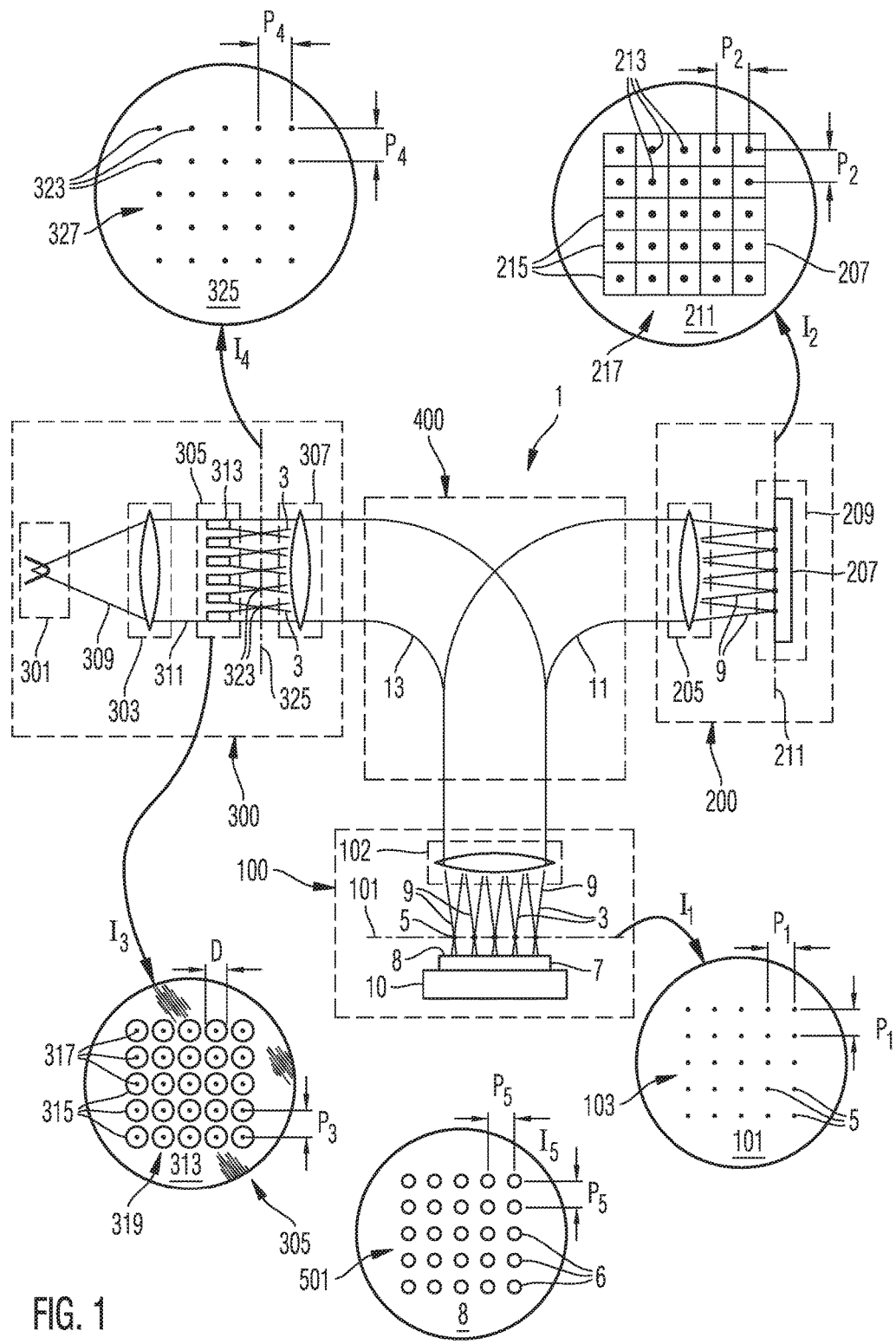
FIG. 1 shows a schematic illustration of a multi-beam particle microscope.

FIG. 1 is a schematic illustration of a multi-beam particle microscope 1 which uses a multiplicity of particle beams, for example beams of ions or electrons. The multi-beam particle microscope generates a multiplicity of primary particle beams 3 which are incident on an object 7 to be examined so as to produce particles there, for example secondary electrons or ions, back-scattered electrons or ions, transmitted electrons or ions or the like, which emerge from the object 7 and are subsequently detected. The multi-beam particle microscope 1 uses a plurality of primary particle beams 3 which are focused in an objective plane 101 of an objective lens 102 of an objective lens system 100 and are incident on a surface 8 of the object 7 and produce there a plurality of particle beam spots. The object 7 to be examined can include, for example, a semiconductor wafer, a biological sample, an arrangement of miniaturized elements or the like. The surface 8 of the object 7 is arranged in the region of the objective plane 101.

The enlarged detail I1 in FIG. 1 shows a plan view of the objective plane 101 having a regular rectangular field 103 of beam foci 5. In FIG. 1, the number of the primary particle beams 3, the beam foci 5 and correspondingly the particle beam spots 6 on the surface 8 of the object 7 is twenty-five (25). The number 25 is a small number chosen for reasons of the simplified illustration. In practice, the number of particle beams 3 or of beam foci 5 or of particle beam spots 6 can be selected to be substantially greater.

In the illustrated embodiment, the field 103 of beam foci 5 is a substantially regular rectangular field having a constant distance $P_1$ between neighbouring beam foci 5. Exemplary values of the distance $P_1$ are 1 µm, 10 µm and 40 µm. However, it is also possible for the field 103 to have different symmetries, such as a hexagonal symmetry.

The enlarged detail I5 in FIG. 1 shows a plan view of the surface 8 of the object 7 having a regular field 501 of particle beam spots 6. The form of the particle beam spots 6, i.e. the shape and size thereof, substantially depends on the form of the primary particle beams 3 on the surface 8 of the object 7. A distance $P_5$ between neighbouring particle beam spots 6 substantially corresponds to the distance $P_1$.

Focusing the particle beams 3 to shape the beam foci 7 or the particle beam spots 6 is effected, for example, by the objective lens system 100, in particular by the objective lens 102 or an object holder 10 on which the object 7 is arranged and which is configured to displace the object 7 relative to the beam foci 5 or the objective lens 102.

The primary particle beams 3 that are incident on the object 7 produce particles which emanate from the particle beam spots 6 on the surface 8 of the object 7. The particles produced on the surface 8 of the object 7 are shaped by the objective lens 102 into secondary particle beams 9. The multi-beam particle microscope 1 provides a particle beam path 11 for guiding the multiplicity of secondary particle beams 9 to a detection system 200. The detection system 200 includes a particle optics having a projection lens 205 for directing the secondary particle beams 9 onto a particle multi-detector 209. The secondary particle beams 9 can be, for example, beams of electrons or ions, in particular backscattered, secondary or transmitted electrons and ions.

The detail I2 in FIG. 1 shows a plan view of a detection plane 211, in which individual detection areas 215 are located on which the secondary particle beams 9 are incident on sites 213. The sites of incidence 213 are located in a field 217 having a regular distance $P_2$ with respect to one another. Exemplary values of the distance $P_2$ are 10 µm, 100 µm and 200 µm. The particle multi-detector 209 includes a multiplicity of detection areas 215. The detection system 200 is designed such that each of the sites of incidence 213 is assigned one detection area 215. The detection areas 215 can be provided by way of a multiplicity of individual detectors or by way of a segmented detector.

The objective lens 102 and the projection lens 205 provide an imaging particle optics for imaging the objective plane 101 onto the detection plane 211. In this way, the intensity of the particles which are produced by the primary particle beams 3 and emanate from the particle beam spots 6 can be detected by the detection system 200.

The primary particle beams 3 are generated in a beam generation apparatus 300, which includes at least one particle source 301, at least one collimation lens 303, a multi-aperture arrangement 305 and a field lens 307. The beam generation apparatus 300 can furthermore include a stigmator. The particle source 301 generates a diverging particle beam 309, which is collimated by the collimation lens 303 to form a beam 311 which illuminates the multi-aperture arrangement 305.

The detail I3 in FIG. 1 shows a plan view of the multi-aperture arrangement 305. The multi-aperture arrangement 305 includes a multi-aperture plate 313 having a plurality of openings or apertures 315 formed therein. The centres 317 of the openings 315 are arranged in a field 319 that corresponds to the field 103 which is formed by the beam foci 5 in the objective plane 101.

A distance $P_3$ of the centres 317 of the apertures 315 from one another can have exemplary values of 5 µm, 100 µm and 200 µm. The diameters D of the apertures 315 are smaller than the distance $P_3$ between the centres of the apertures. Examples of values of the diameters D are $0.2 \times P_3$, $0.4 \times P_3$ and $0.8 \times P_3$.

Particles of the illuminating beam 311 penetrate the apertures 315 and form the primary particle beams 3. The particles of the illuminating beam 311 that are incident on the plate 313 are absorbed thereby and do not contribute to the formation of the primary particle beams 3.

On account of an electrostatic field that has been applied, the multi-aperture arrangement 305 focuses the particle beams 3 such that beam foci 323 are formed in a plane 325. A diameter of the foci 323 can be for example 10 nm, 100 nm and 1 µm.

The field lens 307 and the objective lens 102 provide an imaging particle optics for imaging the plane 325, in which the foci 323 are formed, onto the objective plane 101 such that the field 103 of beam foci 5 is formed there.

A beam switch 400 is arranged in the beam path of the particle optics. The beam switch 400 guides the primary particle beams 3 emanating from the field lens 307 to the objective lens system 100. The beam switch 400 furthermore guides the secondary particle beams 9 emanating from the surface 8 of the object 7 to the detection system 200.

Figure 2:
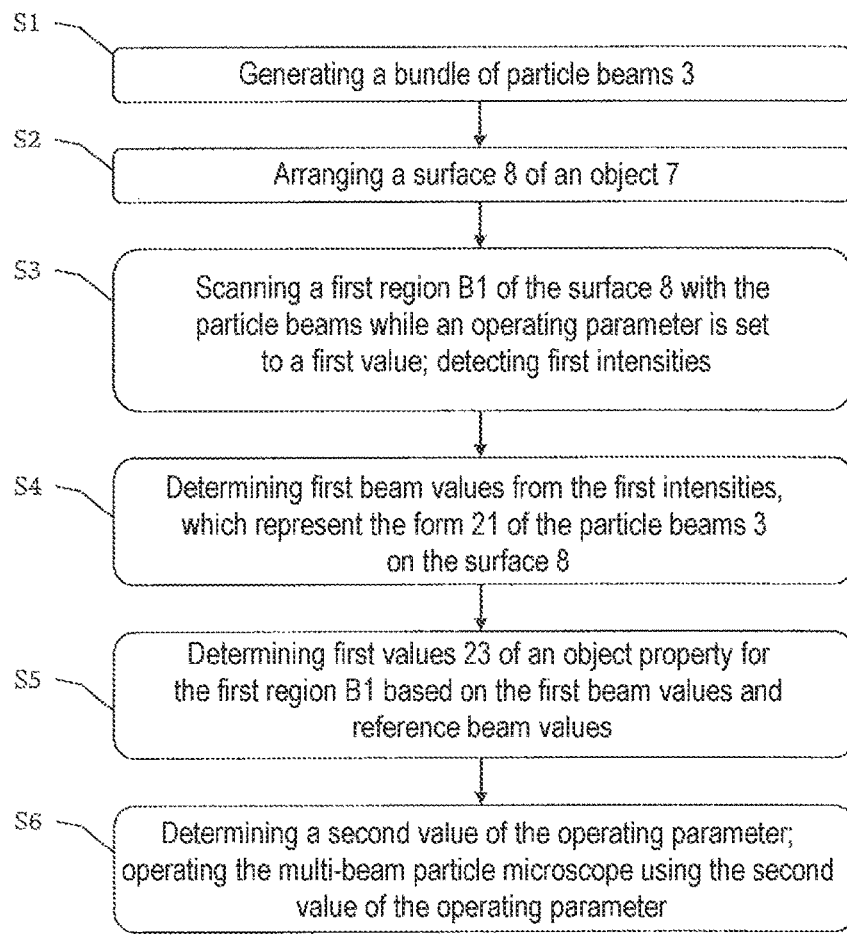
FIG. 2 shows a flowchart of one embodiment of a method for operating the multi-beam particle microscope shown in FIG. 1.
Figure 3:
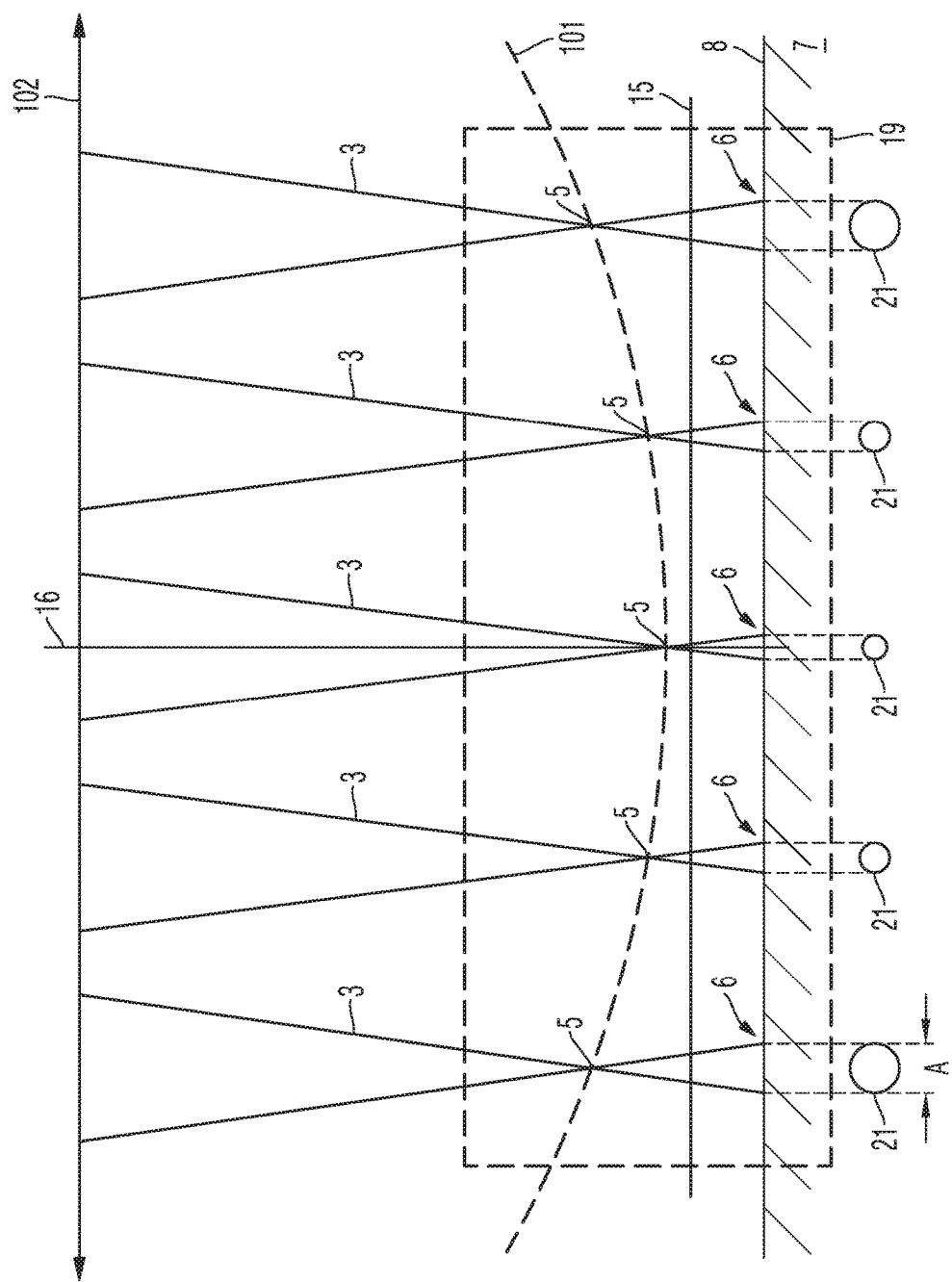
FIG. 3 shows a schematic diagram of a bundle of particle beams that are incident on a surface of an object.

FIG. 2 shows a flowchart of one embodiment of a method for operating the multi-beam particle microscope 1. In a first step S1, a bundle of a multiplicity of particle beams 3 is produced. FIG. 3 shows the bundle of (primary) particle beams 3, which penetrate a predetermined plane 15 side-by-side and do not superpose one another in the process, i.e. a distance between the particle beams 3 in the predetermined plane 15 is greater than a width of an individual particle beam. The predetermined plane 15 in the embodiment shown is a plane that is mathematically exactly flat. However, the predetermined plane 15 can also be a curved area and be generally an area of any desired shape. The predetermined plane 15 intersects an optical axis 16 of the multi-beam particle microscope 1. The optical axis 16 can be, for example, the optical axis of the objective lens 102. The bundle of particle beams 3 is deflectable about the optical axis 16, to which end the multi-beam particle microscope 1 can include one or more deflectors. By deflecting the particle beams 3 from the location shown in FIG. 3, which is characterized in that the propagation direction of the particle beams 3 is oriented parallel to the optical axis 16, it is possible for aberrations to be introduced which increase with the deflection of the particle beams 3 from the optical axis 16. In practice, the angular range in which the particle beams 3 are deflected from the optical axis 16 is hereby limited with respect to the aberrations that are introduced in this way. An area of the surface 8 that can be scanned via the particle beams 3 without displacing the object 7 relative to the optical axis 16 is referred to below as a region.

Each of the particle beams 3 is focused by the objective lens 102 and has a beam focus 5 which is arranged in the objective plane 101. As opposed to the objective plane 101 that is illustrated in FIG. 1 in the form of a plane which is mathematically exactly flat, the objective plane 101 is generally not mathematically exactly flat owing to aberrations of the imaging particle optics from the particle beam generation apparatus 300 to the objective lens 102, but can be a curved area, as is illustrated in FIG. 3. The beam foci 5 of the primary particle beams 3 are arranged in a volume region 19 around the predetermined plane 15. The predetermined plane 15 can include, for example, at least one of the beam foci 5 or overlay the objective plane 101. The predetermined plane 15 can be arranged such that it is arranged substantially orthogonal to the optical axis 16 and has a distance from at least one of the beam foci 5 that is less than 100 µm, 50 µm, 10 µm or 1 µm.

According to a step S2, which follows the step S1 illustrated in FIG. 2, the surface 8 of the object 7 is arranged at least partially within the volume region 19. As a result, the surface 8 is arranged near the beam foci 5.

According to a step S3, which follows step S2 illustrated in FIG. 2, a first region $B_1$ of the surface 8 is scanned with the bundle of particle beams 3. During the scanning, an operating parameter of the multi-beam particle microscope 1 is set to a first value. The operating parameter serves for controlling at least one component of the multi-beam particle microscope 1 which is configured to change a distance of the beam foci 5 from the predetermined plane 15 and/or a form of the particle beams on the surface 8 and/or a position of the object 7 relative to the beam foci 17 or the objective lens 102, for example in a direction parallel to an optical axis 16 of the multi-beam particle microscope 1. The operating parameter can generally serve for controlling at least one component of the multi-beam particle microscope 1 that can influence an aberration. In other words, the operating parameter serves for setting the focusing and/or stigmatization and/or correction of higher-order errors. The at least one component can include a particle-optical lens, for example the particle-optical objective lens 102, a stigmator or another field generator.

Figure 4A:
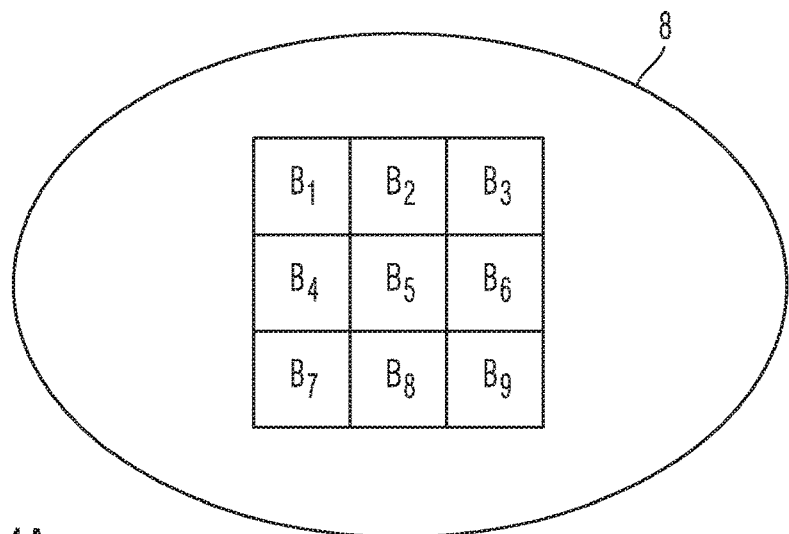
FIGS. 4A to 4C show a spatial division of a detail of the surface into regions, subregions and scanned sites.
Figure 4B:
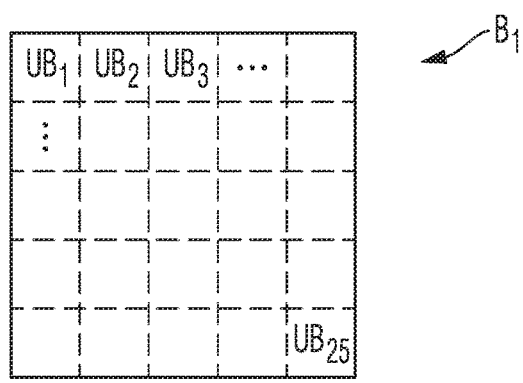
Figure 4C:
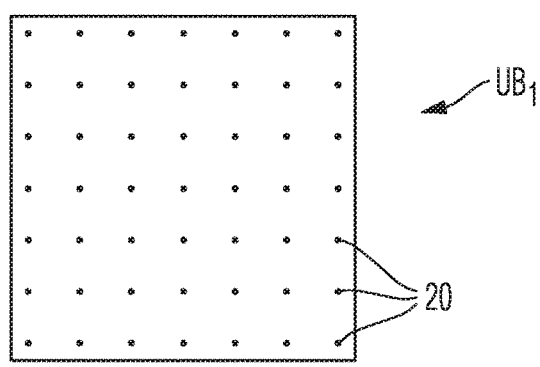

FIGS. 4A to 4C show in plan view of the surface 8 a spatial division of a detail of the surface 8 into regions, subregions of a region and scanned sites of a subregion. FIG. 4A shows nine regions $B_1$ to $B_9$. As explained above, a region is substantially characterized in that the region is an area of the surface 8 which can be scanned with the bundle of particle beams 3 by deflecting the particle beams 3 relative to the optical axis 16, without displacing the object 7 relative to the optical axis 16. In the diagram shown in FIG. 4A, the regions $B_1$ to $B_9$ do not overlap, but are adjacent. Each of the regions $B_1$ to $B_9$ has a square shape. The form of the regions is substantially related to the field 103 of the beam foci 5 and the angular range by which the particle beams 3 are able to be deflected relative to the optical axis 16.

The form of the regions can deviate from the square shape and have, for example, a rectangular or a hexagonal form. In addition, the relative location of the regions with respect to one another, shown in FIG. 4A, is merely an example and can have nearly any desired configuration. However, with respect to the throughput of the multi-beam particle microscope, such an arrangement of the regions in which the regions at most partially overlap and, if desired, overlap as little as possible may be preferred.

During scanning of the first region $B_1$ (and of all further regions), all particle beams 3 of the bundle are directed onto this region $B_1$. By deflecting the particle beams 3, each of the particle beams 3 is directed onto a multiplicity of sites of the surface 8. The sites onto which a single particle beam 3 can be directed by way of deflection define a subregion of the region that is assigned to the particle beam.

FIG. 4B shows a field of subregions $UB_1$ to $UB_{25}$ of the first region $B_1$. The number of subregions in each region $B_1$ to $B_9$ corresponds to the number of particle beams 3 or particle beam spots 6. The arrangement of the subregions relative to one another substantially corresponds to the arrangement of the beam foci 5 in the field 103. Each of the subregions $UB_1$ to $UB_{25}$ has a square form. The form of the subregions is substantially defined by the angles by which the particle beams 3 can be deflected relative to the optical axis 16 and can therefore have substantially any desired form. What may be preferred with respect to the throughput of the multi-beam particle microscope is that the subregions at most partially overlap or overlap as little as possible.

FIG. 4C shows a multiplicity of sites 20 within the subregion $UB_1$, onto which that particle beam is directed by way of deflection to which the subregion $UB_1$ is assigned. The number of sites of incidence and the distances between the sites of incidence substantially determine the accuracy with which the surface 8 of the object 7 can be analysed. Each of the subregions generally has the same number and a similar arrangement of sites 20. Examples of values for the number of sites 20 in each of the subregions are 100×100, 1000×1000 or 10 000×10 000.

The particle beams 3 that are incident on the surface 8 during scanning of the first region $B_1$ produce particles which emanate from the object 7. The particles emanating from the object 7 are shaped by the objective lens 102 to secondary particle beams 9 and guided onto a particle multi-detector 209 so as to be detected there. The number of the detected particles is represented by an intensity. The intensities detected during the scanning of the first region $B_1$ are referred to as first intensities. Each site 20 of each subregion is here assigned the intensity that corresponds to the number of particles which were produced by the particle beam directed onto the site. The first intensities can be presented graphically, as a result of which the surface 8 can be presented graphically.

In a step S4, which follows step S3 that is illustrated in FIG. 2, at least one first beam value for each of the particle beams 3 of the bundle is determined based on those intensities of the first intensities that are assigned to the sites within the subregion onto which the particle beams were directed. By way of example, determining the at least one first beam value for the particle beam which was directed onto the subregion $UB_1$ is based on those intensities of the first intensities that are assigned to the sites 20 within the subregion $UB_1$. Determining the at least one first beam value for a particle beam which was directed onto the subregion $UB_2$ is based on those intensities of the first intensities that are assigned to the sites within the subregion $UB_2$, and so on.

Determination of the at least one beam value can be effected for example by way of an analysis of the image signals that are measured during the scanning of the subregions $UB_1$, $UB_2$ being carried out. In particular, a spatial frequency analysis can be carried out. By way of comparison with the spatial frequencies measured during a calibration measurement with a known sample, it is possible to deduce from the spatial frequencies contained in the image signals in the subregions $UB_1$, $UB_2$ the diameter of the particle beam upon incidence on the surface of the object. If the measured spatial frequencies vary in mutually perpendicular directions, it is possible to deduce that the areas of intersection of the particle beams with the surface of the object form ellipses, which can be caused in turn either by a surface of the object being inclined with respect to the particle beams or by an astigmatism of the particle beams. As already mentioned further above, the spatial frequency analysis can be carried out for example by Fourier analysis or autocorrelation analysis of the image signals in the subregions. Alternatively, it is also possible to apply a gradient method to the image signals in the subregions to determine the at least one beam value.

The at least one first beam value of each of the particle beams represents a form (a cross section) of the particle beam on the surface 8. The form (of the cross section) of a particle beam 3 on the surface 8 substantially corresponds to the form of the particle beam spot 6 on the surface 8 that is produced by the particle beam. As is illustrated in FIG. 3 by way of example, a form 21 of the cross section of the particle beams 3 can have an approximately circular form with a diameter A (the forms 21 of the cross sections of the particle beams 3 are illustrated in a plan view of the surface 8 in a direction that is parallel to the optical axis 16). The cross section of the particle beams 3 can be, for example, a cross section in a plane that is orthogonal to the optical axis 16. A distance between the plane of intersection and the surface 8 can be small. Examples of values are 10 nm, 100 nm, 1 μm or 10 μm. The plane of intersection in which the cross section is situated can intersect in particular with the surface 8.

The value of the diameter A of the form of the cross section of the particle beams 3 on the surface 8 and a size of the particle beam spots 6 on the surface 8 depend both on the configuration of the particle beam 3 and on a distance between the beam focus 5 and the surface 8. For this reason, the form of the cross section of a particle beam, in particular the diameter A of the form, can serve as a measure of the distance between the beam focus 5 and the surface 8, as a result of which this relationship can be used for focusing. Here, the configuration of the particle beam corresponds for example to an angle enclosed between the optical axis 16 and a particle beam 3. This angle is substantially determined by the objective lens 102.

As explained in FIG. 3, a beam value which represents the form 21 of a cross section of a particle beam 3 on the surface 8 of the object 7 can be a diameter A of a circular form. However, the beam value can also be a different parameter which represents the form of a cross section of a particle beam on the surface. For example, the form can be approximated as an ellipse and the beam value can include a length of a long main axis, a length of a short main axis and/or an orientation of the ellipse relative to a reference direction for the purposes of characterization of the form.

The astigmatism of the individual particle beams 3 which can be quantified by characterizing the form in the shape of an ellipse is caused on the one hand by the particle beam generation apparatus and on the other hand by electric fields generated by the object (for example on the basis of charges within the object 7) or magnetic fields generated by the object (for example on the basis of magnetization of the object). The form of the particle beams 3 is changed by these electric or magnetic fields in the region of the surface 8. The beam values can therefore be used as a measure of the charge distribution or distribution of the magnetization within the object 7.

Figure 5A:
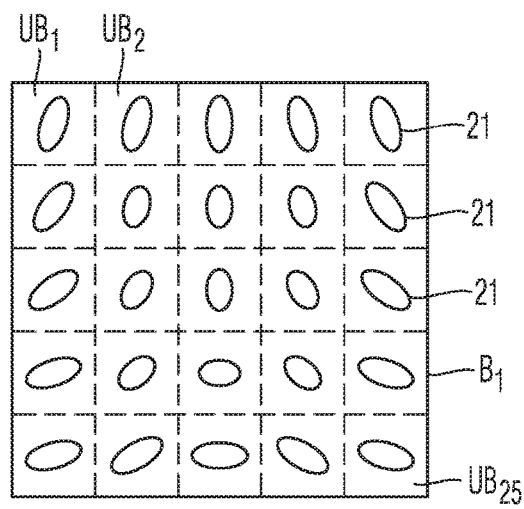
FIGS. 5A to 5C show a schematic diagram of forms of a cross section of the particle beams on the surface for different values of an operating parameter of the multi-beam particle microscope.
Figure 5B:
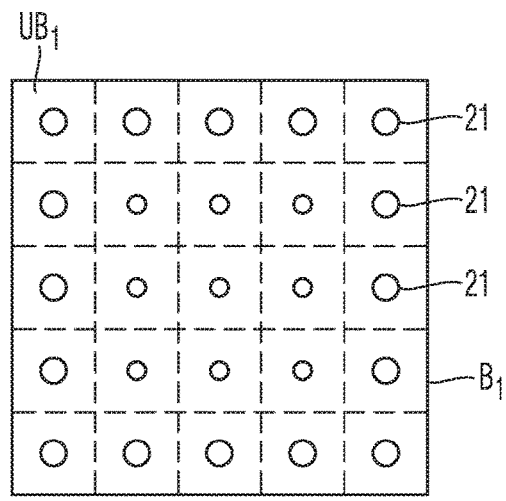
Figure 5C:
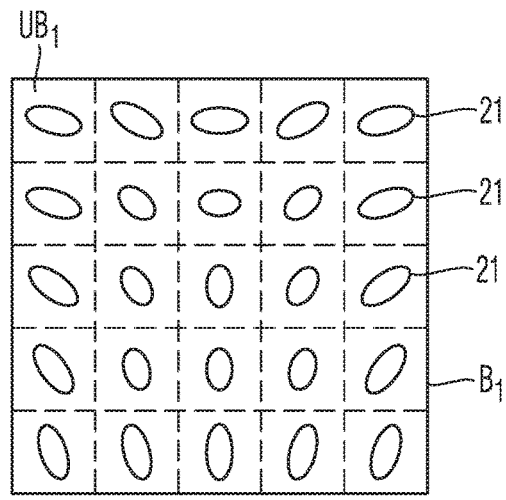

FIGS. 5A to 5C schematically illustrate the relationship between beam values and the object property. The beam values depend on the object property, i.e. if the object property changes, the beam values change as well. The relationship is explained by way of the example of focusing, i.e. the object property is considered to be the spatially resolved height distribution. However, an analogous relationship also exists if the object property represents the spatially resolved charge or field distribution.

FIG. 5A shows a diagram of the forms 21 of a cross section of the particle beams 3 on the surface 8, wherein the objective lens system 100 is set to be underfocused, i.e. the beam foci 5 are situated behind the surface 8 in the direction of the propagation direction of the particle beams 3. The beam values represent the forms 21. In the diagram of FIGS. 5A to 5C, each subregion or each particle beam is assigned a beam value or a form 21, which is indicated by dashed lines.

On account of aberrations which are immanent to the particle beam optics between the beam generation apparatus 300 and the objective lens 102, the primary particle beams 3 can be astigmatically shaped. Each of the astigmatically shaped particle beams 3 has two line foci which are oriented orthogonally relative to one another and to the propagation direction of the particle beams 3 and in the centre of which along the propagation direction the beam focus 5 is situated.

Since FIG. 5A illustrates a situation in which the objective lens system 100 is underfocused, the forms of the cross sections of the particle beams 3 on the surface 8 have an elliptic shape. The form of a cross section of each individual one of the particle beams 3, represented by the at least one beam value, for example the diameter of a circular form, the long and/or short main axis and/or orientation of an ellipse, depends on the object property, in this example the height, i.e. the distance between the surface 8 of the object and the beam focus 5, such that the beam value can serve as a measure of this distance and thus of the object property.

FIGS. 5B and 5C clarify this relationship. FIG. 5B shows the forms 21 of the cross sections of the particle beams 3, wherein the surface 8 is in focus, i.e. the distance between the beam foci 5 and the surface 8 is small. The forms 21 have a circular form. The smaller the form, the better the focusing, and vice versa.

FIG. 5C shows the forms 21 of the cross sections of the particle beams 3, wherein the objective lens system 100 is overfocused, i.e. the beam foci 5 are situated in front of the surface 8 of the object 7 in the direction of the propagation direction of the particle beams 3. The forms 21 are therefore elliptically shaped again.

Compared to FIGS. 5A to 5C, in particular compared to the form 21 of each of the subregions, for example compared to the forms 21 illustrated in subregion $UB_1$, it is clear that the form is directly related to the distance between the surface 8 and the corresponding beam focus 5.

Based on the beam values of a plurality of different particle beams 3 of the bundle, for example the forms 21 of the subregions $UB_1$ and $UB_{25}$, which were determined using the same value for the operating parameter, it is possible to determine whether the objective lens system 100 is set to be overfocused or underfocused. This is explained by way of example with reference to FIG. 6.

Figure 6:
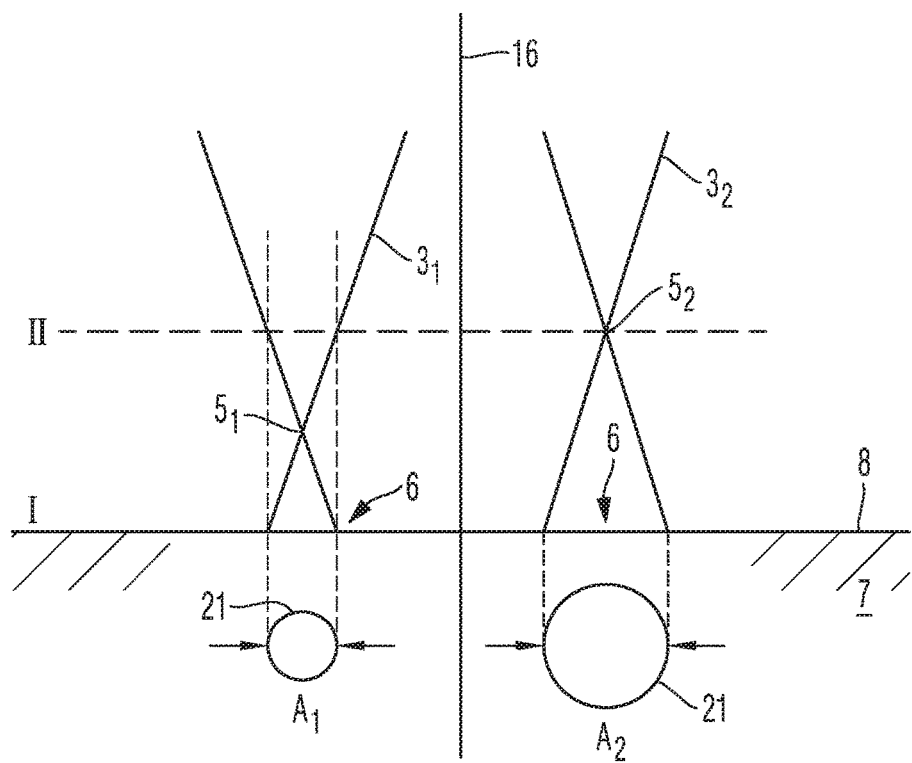
FIG. 6 shows a schematic diagram of a relationship between beam values of two particle beams of the bundle.

FIG. 6 shows two exemplary particle beams $3_1$ and $3_2$ of the bundle, which are incident on the surface 8 of the object 7 and there illuminate particle beam spots 6. The beam foci $5_1$ and $5_2$ of the particle beams $3_1$ and $3_2$ are spaced apart from one another in a direction parallel to the optical axis 16. The distance between the beam foci $5_1$ and $5_2$ along the direction parallel to the optical axis 16 is caused for example by the image field curvature of the particle-optical system between the beam generation apparatus 300 and the objective lens 102 (see curved objective plane 101 in FIG. 3). Each of the two particle beams $3_1$ and $3_2$ in each case generates one particle beam spot 6 on the surface 8, which is nearly identical to the form 21 of the cross section of the particle beam $3_1$ or $3_2$ on the surface 8 which illuminates the particle beam spot. The particle beam $3_1$ has a form 21, which, for the sake of simplified explanation, is circular and has a diameter $A_1$. The particle beam $3_2$ likewise has a circular form 21, but with a greater diameter $A_2$. The difference with respect to the diameters $A_1$ and $A_2$ is due to the different distances of the beam foci $5_1$ and $5_2$ from the surface 8. Even though it is possible to determine a distance between the beam focus $5_1$ and the surface 8 from the diameter $A_1$, it may not necessarily be possible to determine whether the particle beam $3_1$ is overfocused, as in the present case designated by the position I, or whether the particle beam $3_1$ is underfocused, as designated by the position II. The positions I and II have the same distance from the beam focus $5_1$ of the particle beam $3_1$ in a direction parallel to the optical axis 16. With the proviso that the relative location of the beam foci $5_1$ and $5_2$ is known, it is also possible to determine using the diameter $A_2$ of the form 21 of the particle beam $3_2$ whether the particle beam $3_1$ is overfocused or underfocused. It is possible by way of example to deduce from the ratio of diameters $A_1$ and $A_2$ whether the particle beam $3_1$ is overfocused or underfocused. If the relative location of the beam foci $5_1$ and $5_2$ is known, as is illustrated in FIG. 6, it is possible by way of example to deduce that the particle beam $3_1$ is overfocused if the diameter $A_1$ is smaller than the diameter $A_2$. It is possible to deduce in the same manner that the particle beam $3_1$ is underfocused if the diameter $A_1$ is greater than the diameter $A_2$ (for example if the surface 8 were situated in the position II). In the description of the principle that was just explained, a diameter of the cross section of the particle beams 3 was used for the beam value. As described above, the beam value can also represent a different parameter of the form of the cross section, for example the long and/or short main axis and orientation of an ellipse.

In a step S5, which follows step S4 illustrated in FIG. 2, at least one first value of the object property (height value) is determined based on the first beam values and reference beam values, wherein each of the at least one first height value represents a distance between a site on the surface 8 that is arranged within the first region $B_1$ and the predetermined plane 15.

Figure 7:
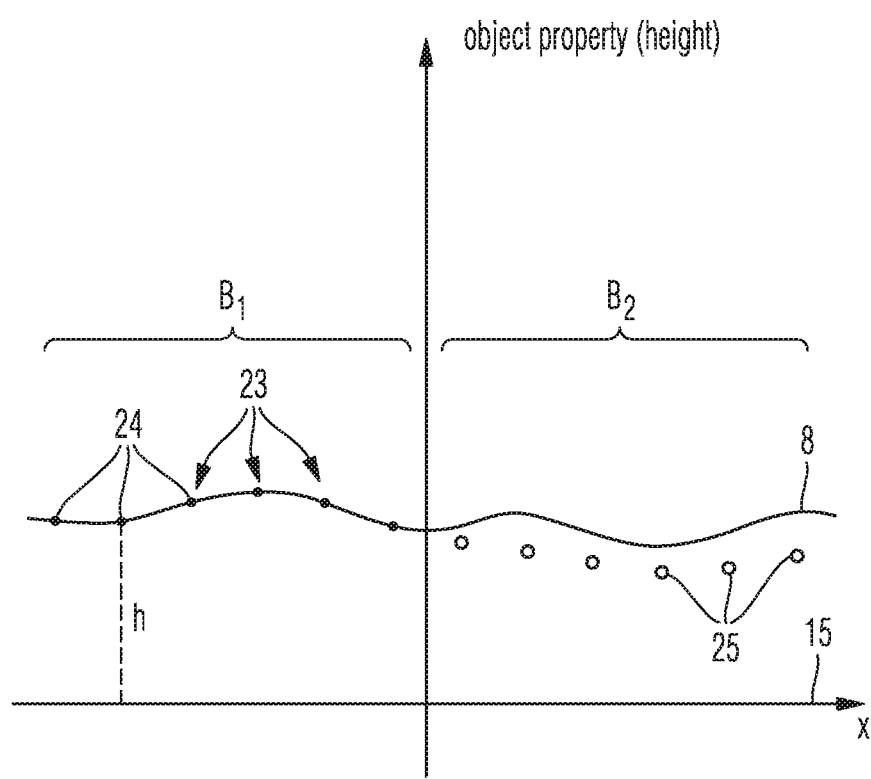
FIG. 7 shows a schematic diagram of values of an object property of a first region of the surface and of prediction values of a second region of the surface.

FIG. 7 shows a cross section through the object 7 along a spatial dimension x and the surface 8 thereof. The points 23 are an illustration of first values of the object property, in the present example first height values at sites 24, which are arranged within the first region $B_1$. The height values (values of the object property) 23 represent a distance h between the sites 24 on the surface 8 within the first region $B_1$ from the predetermined plane 15. It is possible in particular to determine at least one first height value 23 for each of the subregions of the first region $B_1$ based on the first beam values and possibly using the reference beam values.

As shown in FIG. 2, it is possible in a step S6, which follows step S5, to determine a second value of the operating parameter, for example on the basis of the first values of the object property (first height values) 23. Subsequently, the multi-beam particle microscope 1 can be operated using the second value of the operating parameter. By way of example, a second region $B_2$ can be scanned and analysed using the second value for the operating parameter. The second region can substantially correspond to the first region $B_1$ so that the same region can be scanned using an optimized setting with respect to focusing and/or stigmatization and/or correction of higher-order errors.

A further embodiment of the method, in which the second value of the operating parameter is determined for use for a second region $B_2$, which at most partially overlaps the first region $B_1$, is described below with reference to FIG. 8. FIG. 4A and FIG. 7 show the first region $B_1$ and the second region $B_2$ in plan view or in cross section, wherein the two regions $B_1$ and $B_2$ are adjacent to one another. First values of the object property (first height values) 23 of the first region $B_1$ have already been determined, for example as in the embodiment explained previously. This corresponds to step S10 shown in FIG. 8.

To this end, operating currents or operating voltages are applied to the corresponding particle-optical components, such as the objective lens 102, stigmators or other particle-optical correction elements not shown in FIG. 1, before the second region is scanned or before the region which has already been scanned is scanned again, such that the particle beam system has the second value of the operating parameter.

In a step S11, which follows step S10, first prediction values (first prediction height values) 25 of the second region $B_2$ are determined based on the first values of the object property (first height values) 23 of the first region $B_1$ (see FIG. 7). Each of the first prediction height values 25 represents a predicted distance (h) between a prediction site that is arranged within the second region $B_2$ on the surface 8 and the predetermined plane 15.

Determining prediction values generally and determining prediction height values specifically can be effected, for example, by extrapolation and/or interpolation of already known values of the object property (height values). For extrapolation and/or interpolation, it is possible with preference to use such values of the object property (height values) that are arranged in the proximity of the sites of which the values (height values) are to be predicted. Extrapolation and/or interpolation can be effected in particular using a physical model for the surface of the object or a physical model for the object as a whole. In this example, the object can be described as a clamped plate, as a result of which the surface of the object cannot be deformed in any desired fashion.

Figure 9A:
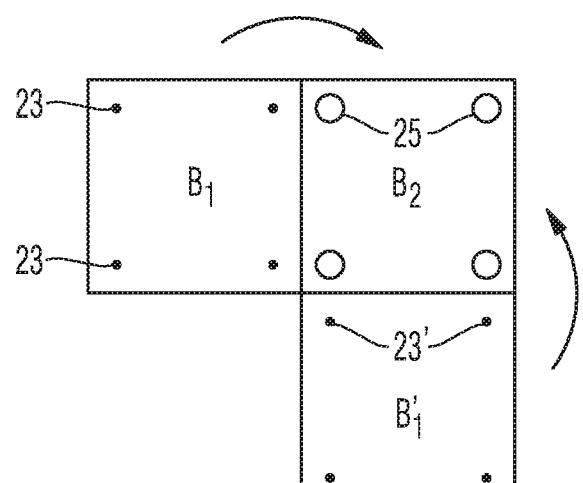
FIGS. 9A to 9C show exemplary arrangements of first, second and third regions for extrapolation and interpolation of values of an object property for obtaining prediction values.
Figure 9B:
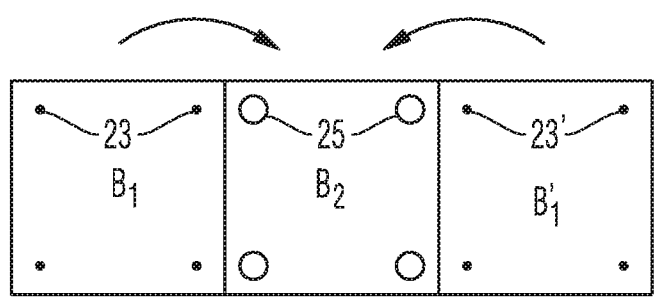

As illustrated in FIGS. 9A and 9B, first values of the object property (first height values) of a plurality of different first regions can be used for determining the first prediction values (prediction height values) 25 of the second region $B_2$. The plurality of first regions can be arranged variably around the second region, as is illustrated in FIGS. 9A and 9B. By way of example, it is possible to use the first values of the object property (first height values) 23 of the region $B_1$ and the first values of the object property (first height values) 23' of a further first region $B_{1'}$ for determining the first prediction values (prediction height values) 23. The first regions, in particular for the first regions $B_1$ and $B_{1'}$, have in common that the values of the object property (height values) which have been determined for them were determined in each case using an arbitrarily set value of the operating parameter. In particular at the beginning of the analysis of a larger object, merely a simple estimation of the operating parameter is available with which the plurality of first regions are scanned.

FIG. 9A illustrates the determination of the first prediction values (first prediction height values) 25 using extrapolation, which is illustrated by way of arrows. FIG. 9B illustrates the determination of the first prediction values (first prediction height values) 25 using interpolation, which is likewise illustrated by way of arrows.

Figure 8:
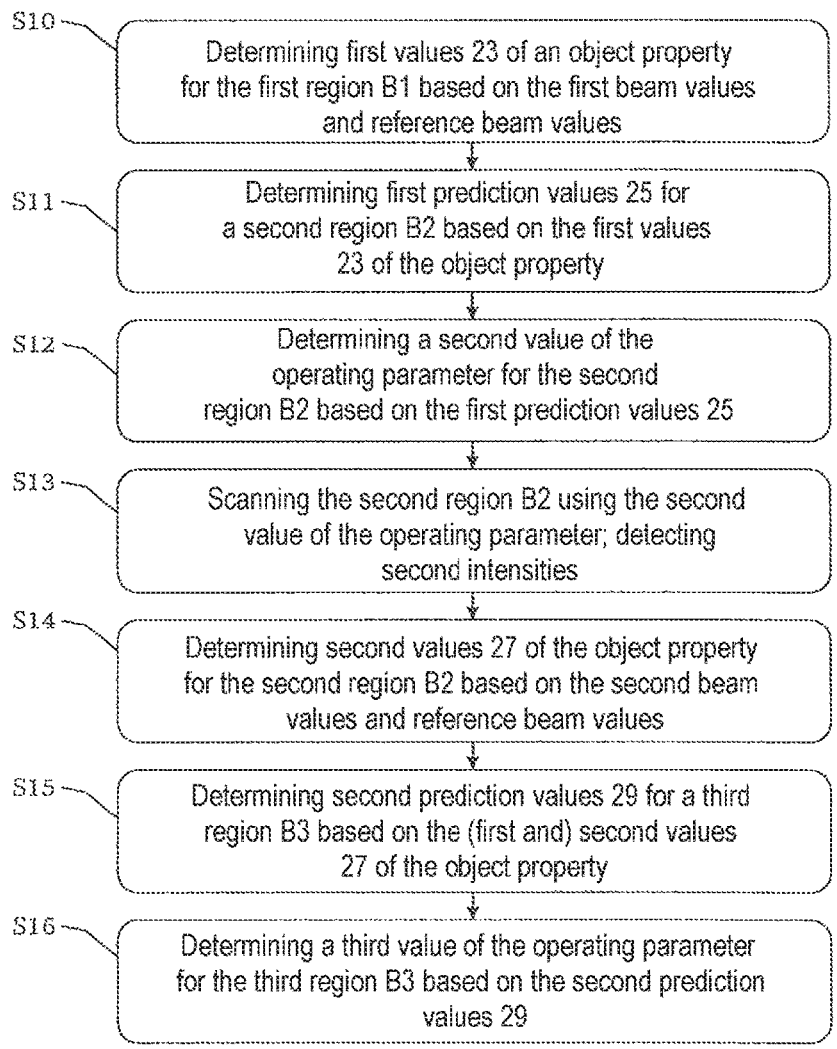
FIG. 8 shows a flowchart of a part of a further embodiment of a method for operating the multi-beam particle microscope shown in FIG. 1.

In a step S12, which follows step S11 shown in FIG. 8, a second value of the operating parameter is determined for the second region $B_2$ based on the first prediction values (first prediction height values) 25. It is possible in this way to set for example the focusing and/or stigmatization and/or correction of higher-order errors for scanning the second region $B_2$ in dependence on the prediction values (prediction height values) 25 of the second region $B_2$.

In a step S13, which follows step S12, the second region $B_2$ can subsequently be scanned with the bundle of particle beams 3, and second intensities can be detected. In order to scan the second region $B_2$ with the bundle of particle beams 3, it may be involved for the object to be displaced relative to the optical axis 16, for example by corresponding actuation of the object holder 10 on which the object 7 is placed (see FIG. 1).

Since second intensities are now also available for the second region $B_2$, just as previously first intensities were available for the first region $B_1$, the previously described procedure can be carried out again. This is illustrated by way of example in steps S14 to S16 of FIG. 8, which follow step S13.

In step S14, second values of the object property (second height values) 27 of the second region $B_2$ are determined based on the second beam values, which can be determined from the second intensities as previously explained, and possibly based on the reference beam values.

Figure 9C:
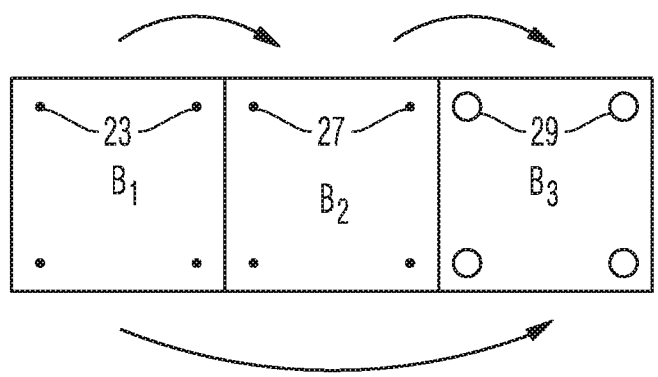

In a subsequent step S15, second prediction values (second prediction height values) 29 of a third region $B_3$ are determined based on the second values of the object property (second height values) 27. In addition, is also possible to use first values of the object property (first height values) 23 of the first region $B_1$ for determining the second prediction values (second prediction height values) 29. This is illustrated schematically in FIG. 9C by way of arrows. The second prediction values (second prediction height values) 29, which represent a predicted distance between a second prediction site on the surface 8, which is arranged within the third region $B_3$, and the predetermined plane 15, can be determined based on the first values of the object property (first height values) 23 of the first region $B_1$ and the second values of the object property (second height values) 27 of the second region $B_2$, wherein the values of the object property (second height values) 27 of the second region $B_2$ were determined according to the method illustrated in steps S10 to S14. Analogously to the illustrations in FIGS. 9A and 9B, it is also possible to use values of the object property (height values) of a plurality of first regions and/or values of the object property (height values) of a plurality of second regions for determining the second prediction values (second prediction height values) 29. Determination of the second prediction values (second prediction height values) 29 can also be effected via extrapolation and/or interpolation, in particular using the physical model.

A third value of the operating parameter for use for the third region $B_3$ can be determined based on the second prediction values (second prediction height values) 29 of the third region $B_3$, as is illustrated in step S16 of FIG. 8.

In specific embodiments of the described method, it is also possible to apply a small offset potential or a small offset current to particle-optical correction elements, which act independently on at least one particle beam, such as stigmators for correcting an image field astigmatism, or lenses for correcting an image field curvature, which offset potential or offset current is selected such that the evaluation sensitivity during the determination of the at least one beam value is increased by the offset potential or the offset current at least for individual particle beams, but at the same time does not significantly negatively influence the cross section of the particle beam on the surface of the object or in the objective plane 101, such that no unacceptable deteriorations of the resolution of the image information that was obtained by scanning the surface of the object with the particle beams arise.

What is claimed is:

1. A method of operating a multi-beam particle microscope, the method comprising:
   generating a multiplicity of particle beams so that the multiplicity of particle beams penetrates a predetermined plane side-by-side, each particle beam of the multiplicity of particle beams having one beam focus within a volume region around the predetermined plane;
   arranging a surface of an object at least partially within the volume region;
   scanning a first region of the surface with the multiplicity of particle beams and detecting first intensities of particles produced by the multiplicity of particle beams that are incident on the first region, while an operating parameter of the multi-beam particle microscope is set to a first value,
   determining first values of an object property based on the first intensities, and
   determining first beam values based on the first intensities,
   wherein:
      the first values represent the object property within the first region, the object property represents a physical property of the object;
      the first beam values represent at least one property of the multiplicity of particle beams on the surface of the object;
      the at least one property of the multiplicity of particle beams on the surface of the object comprises a member selected from the group consisting of shapes of the multiplicity of particle beams on the surface of the object and sizes of the multiplicity of particle beams on the surface of the object; and
      the first values of the object property are determined based on the first beam values.

2. The method of claim 1, wherein the object property represents at least one of the following:
   a spatially resolved charge distribution;
   a spatially resolved distribution of the magnetization; and
   a spatially resolved field distribution of electric and/or magnetic fields which are generated by a charge within the object or a magnetization of the object.

3. The method of claim 1, wherein:
   each of the multiplicity of particle beams scans in each case a subregion of the first region and to this end is directed successively onto a multiplicity of sites within the respective subregion, the subregions at most partially overlapping;
   each of the sites is assigned the intensity caused during the directing of the respective particle beam onto the site; and
   the first values of the object property for each of the subregions of the first region are determined in each case on the basis of the first intensities that are assigned to the sites within the subregion.

4. The method of claim 1, wherein each of the multiplicity of particle beams scans in each case a subregion of the first region and is directed successively onto a multiplicity of sites within the respective subregion, wherein the subregions at most partially overlap, and at least one first beam value is determined for each of the multiplicity of particle beams on the basis of the first intensities caused by the respective particle beam.

5. The method of claim 1, further comprising:
providing reference beam values which represent at least one property of the multiplicity of particle beams at a reference surface of a reference object; and
determining a deviation between the first beam values and the reference beam values, and
wherein the first values of the object property are determined based on the deviation.

6. The method of claim 5, comprising using a physical model to determine the first values of the object property based on the deviation.

7. The method of claim 5, further comprising determining a second value of the operating parameter for use for a second region of the surface based on the first values of the object property.

8. The method of claim 7, further comprising determining prediction values based on values of the object property, wherein the prediction values represent a predicted value of the object property for the second region, the values of the object property include at least the first values of the object property, and the second value of the operating parameter is determined based on the prediction values.

9. The method of claim 8, wherein determining the prediction values comprises extrapolating and/or interpolating the values of the object property.

10. The method of claim 8, wherein the values of the object property further comprise:
further values of the object property representing the object property within at least a further region of the surface,
wherein the at least one further region in each case at most partially overlaps the first and second regions.

11. The method of claim 7, wherein the second value of the operating parameter is different from the first value of the operating parameter.

12. The method of claim 7, wherein at least one of the following holds:
the second region at least partially overlaps the first region;
the second region overlaps at least 50% of a total area of the first region; and
a geometric centre of the second region has a distance from a geometric centre of the first region that is at most 50% of an extent of the first region.

13. The method of claim 7, wherein at least one of the following holds:
the second region at most partially overlaps the first region;
the second region overlaps at most 50% a total area of the first region;
a geometric centre of the second region has a distance from a geometric centre of the first region that is at least 50% of an extent of the first region.

14. The method of claim 1, wherein the operating parameter is used for controlling at least one component of the multi-beam particle microscope which is configured to change a distance of the beam foci from the predetermined plane and/or a form of the multiplicity of particle beams on the surface and/or a position of the object in a direction parallel to an optical axis of the multi-beam particle microscope.

15. The method of claim 14, wherein the at least one component comprises a field generator to generate electric and/or magnetic fields.

16. The method of claim 1, wherein the multi-beam particle microscope has an optical axis about which the multiplicity of particle beams is deflectable and wherein the predetermined plane is oriented substantially orthogonally to the optical axis.

17. The method of claim 1, further comprising displacing the object in a direction that is substantially orthogonal to an optical axis of the multi-beam particle microscope during the scanning of the surface of the object.

18. The method of claim 1, further comprising producing an image of the surface of the object from the detected intensities.

19. The method of claim 18, wherein, other than the multiplicity of particle beams, no other particle beams reach the surface.

20. The method of claim 5, wherein providing the reference beam values comprises calculating the reference beam values on the basis of data which represent properties of the multiplicity of particle beams.

21. The method of claim 5, wherein providing the reference beam values comprises determining the reference beam values using the multi-beam particle microscope and the reference object with the reference surface.

22. The method of claim 21, wherein determining the reference beam values comprises:
arranging the reference surface of the reference object at least partially within the volume region;
scanning the reference surface with the multiplicity of particle beams and detecting intensities of particles produced by the multiplicity of particle beams that are incident on the reference surface, during the scanning of the reference surface; and
determining the reference beam values based on the intensities detected during the scanning of the reference surface.

23. The method of claim 22, wherein at least one reference beam value for each of the multiplicity of particle beams is determined based on the intensities detected during the scanning of the reference surface.

24. The method of claim 1, wherein the beam values and/or the reference beam values are determined via a gradient method, a Fourier analysis, or an autocorrelation.

25. The method of claim 21, wherein:
the reference surface has a root mean square surface roughness of less than 5 µm; and
the root mean square surface roughness of the reference surface is, averaged over a length of the reference surface that is at least 100 µm, a difference between height values of sites on the reference surface and a linear mean of the height values.

26. The method of claim 1, wherein the object property represents a spatially resolved height distribution representing a distance between a site on the surface and the predetermined plane.

27. A method for operating a multi-beam particle microscope, comprising:
generating a multiplicity of particle beams so that the multiplicity of particle beams penetrates a predetermined plane side-by-side, each particle beam having one focus within a volume region around the predetermined plane;
arranging a surface of an object at least partially within the volume region;

scanning a first region of the surface with the multiplicity of particle beams and detecting first intensities of particles produced by the multiplicity of particle beams that are incident on the first region, while an operating parameter of the multi-beam particle microscope is set to a first value;

determining, based on the first intensities, a first beam value of a first particle beam of the multiplicity of particle beams, wherein the first beam value of the first particle beam represents a member selected from the group consisting of a shape of the first particle beam on the surface of the object and a size of the first particle beam on the surface of the object;

determining, based on the first intensities, a first beam value of a second particle beam of the multiplicity of particle beams, wherein the first particle beam is different from the second particle beam, wherein the first beam value of the second particle beam represents a member selected from the group consisting of a shape of the second particle beam on the surface of the object and a size of the second particle beam on the surface of the object;

determining a first value of a physical property of the object within the first region by using both the first beam value of the first particle beam and the first beam value of the second particle beam.

28. The method according to claim 27, wherein the determining of the first value of the physical property of the object within the first region is based on a comparison of the first beam value of the first particle beam and the first beam value of the second particle beam.

* * * * *